United States Patent [19]
Ohshima et al.

[11] Patent Number: 4,997,719
[45] Date of Patent: Mar. 5, 1991

[54] NIOBIUM-CONTAINING SUPERCONDUCTOR-LAMINATED AROMATIC POLYIMIDE MATERIAL

[75] Inventors: Shigetoshi Ohshima, Yonezawa; Ryoichi Sato; Kenichiro Yano, both of Tokyo, all of Japan

[73] Assignee: UBE Industries, Ltd., Japan

[21] Appl. No.: 423,209

[22] Filed: Oct. 17, 1989

[30] Foreign Application Priority Data

Oct. 25, 1988 [JP] Japan ............... 63-267203
Oct. 25, 1988 [JP] Japan ............... 63-267204

[51] Int. Cl.$^5$ .............................. B32B 9/00
[52] U.S. Cl. ..................... 428/473.5; 428/411.1; 428/457; 428/461; 428/901; 428/930; 505/806; 505/884; 505/1
[58] Field of Search ............ 428/411.1, 473.5, 688, 428/901, 930, 461, 457; 505/1, 806, 884

[56] References Cited
U.S. PATENT DOCUMENTS 4,828,931  5/1989  Ogawa et al. ............... 174/35 MS
4,871,316 10/1989  Herrell et al. .................... 439/66

Primary Examiner—Patrick J. Ryan
Attorney, Agent, or Firm—Finnegan, Henderson, Farabow, Garrett and Dunner

[57] ABSTRACT

A flexible Nb-containing superconductor-laminated aromatic polyimide material useful for superconducting wires and circuits, comprising an Nb-containing superconductor layer formed on an aromatic imide polymer substrate, which preferably comprise a polymerization-imidization product of an aromatic tetracarboxylic acid component comprising, as a major ingredient, a biphenyltetracarboxylic dianhydride with an aromatic diamine component comprising, as a major ingredient, an aromatic diamine having a one benzene ring structure.

17 Claims, 5 Drawing Sheets

NIOBIUM-CONTAINING SUPERCONDUCTOR-LAMINATED AROMATIC POLYIMIDE MATERIAL

BACKGROUND OF THE INVENTION

1. Field of the Invention

The present invention relates to a niobium (Nb)-containing superconductor-laminated aromatic polyimide material. More particularly, the present invention relates to a flexible Nb-containing superconductor-laminated aromatic polyimide material in which an Nb-containing superconductor layer is formed on a substrate in the form of, for example, a film or filament, and comprises an aromatic imide polymer having an excellent heat resistance.

2. Description of the Related Art

Various highly efficient superconductors comprising a metal, alloy or metal compound and exhibiting a superconducting property at the temperature of liquid helium or higher are known, and those superconductors are utilized over a wide range of applications, for example, transportation systems, heavy electric machinery, computers, and medical machines, and further improvements thereof, and therefore an even wider range of utilization thereof, are expected.

Interest is now shown in Nb containing superconducting materials as superconductor materials having a high mechanical strength and a critical temperature of about 15 K higher than the liquifying temperature of helium. In particular, it has been found that NbN exhibits a high intensity of the super-conducting critical magnetic field $Hc_2$ and little deterioration of the superconducting property thereof due to stress in a high magnetic field, and thus is expected to be especially useful as a superconducting magnetic material. Also, it was found that the NbN exhibits relatively little deterioration of the superconducting property thereof when exposed to irradiation by neutrons, and thus is expected to be useful as a magnetic material for nuclear fusion.

When used as a magnet or electron device in practice, the superconducting material comprising a metal, alloy or metal compound must be shaped into a wire form, tape form, thick film form or thin membrane form, and supported by a substrate (or support) in the form of a wire, tape, film or plate.

It is known that the substrate can comprise a shaped ceramic material in the form of a filament or plate made from, for example, ZrO, MgO, $Al_2O_3$ or $SiO_2$, and attempts have been made to provide superconducting materials usable for superconducting circuits and magnetic-shielding plate, in which a superconductor layer is formed on the conventional substrate. Nevertheless, the conventional substrates made from inorganic ceramic material are disadvantageous in that, when the substrate must be shaped by complicated shaping or forming procedures, the resultant substitrates are far too heavy and rigid and have an unsatisfactory mechanical strength.

Especially, when inorganic ceramic materials are shaped to form a light substrate or a thin membrane substrate, the resultant substrates have a significantly reduced mechanical strength.

Also, attempts have been made to produce superconductor composite wires by embedding a superconductor wire in a matrix comprising an Ag, Cu or a Cu-Sn alloy. Nevertheless, these attempts are not always successful in practical use, due to severe restrictions on combinations of the type of superconductor material with the type of matrix material, and an unsatisfactory forming property and weight of the resultant composite superconductor wire.

Accordingly, it is difficult to produce a composite superconducting material having a high flexibility, a low weight, and a high mechanical strength, in the form of a thin membrane or wire, by the conventional method in which an Nb-containing superconductor layer is formed on a conventional substrate.

Accordingly, there is a strong demand for the provision of a flexible and light weight substrate which can be easily shaped or formed, exhibits a satisfactory heat resistance, mechanical strength, and stability, even at a high temperature at which a superconductor layer is formed on the substrate, and has a good durability, flexibility and mechanical strength even at an extremely low temperature at which, for example, liquid nitrogen is stably maintained in the liquid state, and useful for producing practically useful superconducting materials.

SUMMARY OF THE INVENTION

Therefore, an object of the present invention is to provide an Nb-containing superconductor-laminated aromatic polyimide material in which an Nb-containing superconductor layer is formed on a substrate having a satisfactory mechanical strength, stability, heat resistance and durability, even at a high temperature at which the superconductor layer is formed on the substrate and even at an extremely low temperature, for example, the temperature of liquid nitrogen.

Another object of the present invention is to provide an Nb-containing superconductor-laminated aromatic polyimide material in which an Nb-containing superconductor layer is formed on a substrate which can be easily produced in a predetermined form and has a satisfactory flexibility and a light weight.

The above-mentioned objects can be attained by the Nb-containing superconductor-laminated aromatic polyimide material of the present invention, which comprises a substrate comprising an aromatic imide polymer, and a layer comprising a Nb-containing superconductor and laminated on the aromatic imide polymer substrate.

The aromatic imide polymer preferably comprises a polymerization-imidization product of an aromatic tetracarboxylic acid component comprising 50 to 100 molar % of at least one member selected from the group consisting of biphenyltetracarboxylic acids, and dianhydrides, esters and salts of the above-mentioned acids and 0 to 50 molar % of at least one member selected from the group consisting of aromatic tetracarboxylic acids other than the biphenyltetracarboxylic acids, and dianhydrides, esters and salts of the other acids; with an aromatic diamine component comprising 50 to 100 molar % of at least one aromatic diamine having one benzene ring structure and 0 to 50 molar % of at least one aromatic diamine other than the above-mentioned aromatic diamine.

DESCRIPTION OF THE PREFERRED EMBODIMENTS

Figure 1:
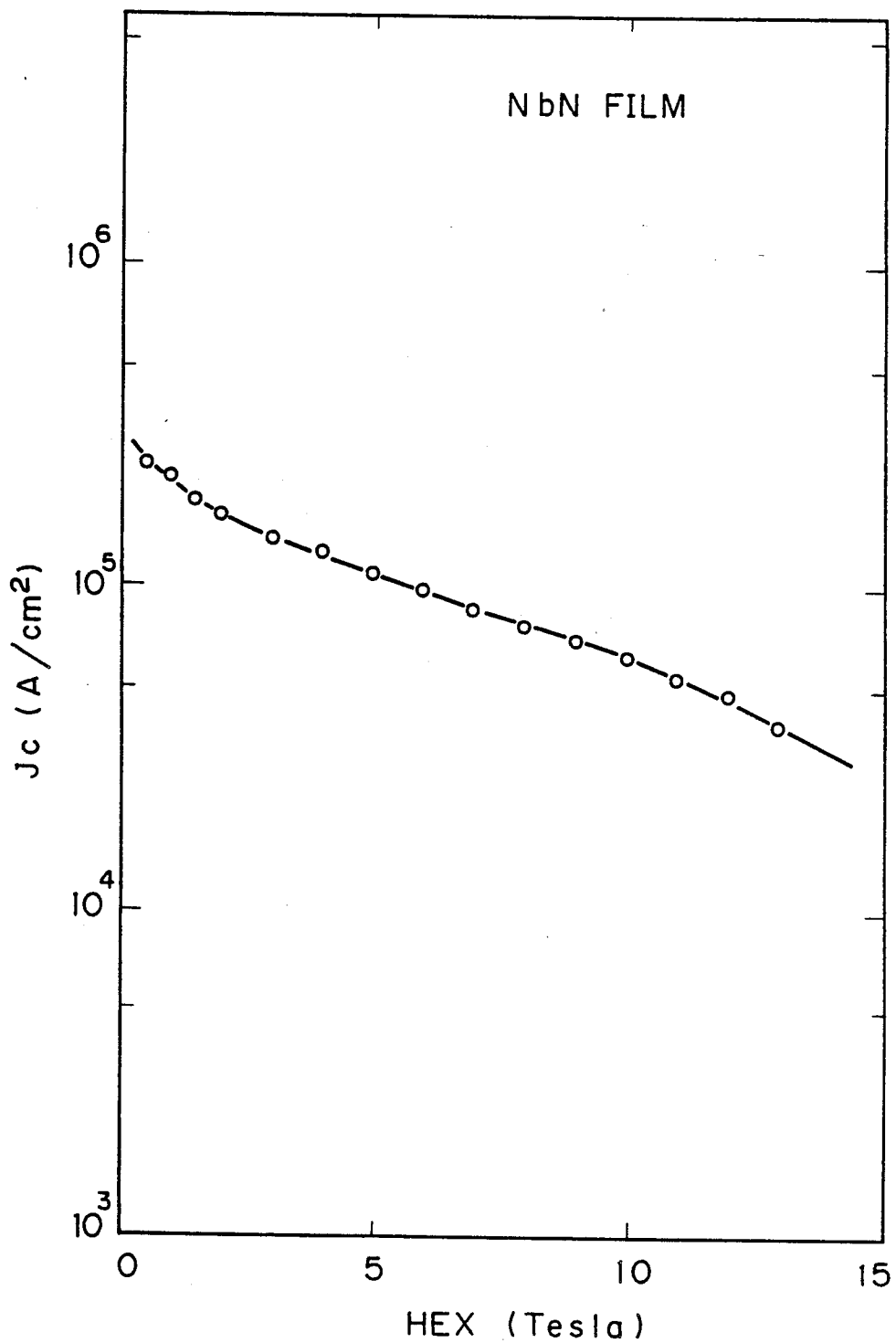
FIG. 1 is a graph showing a relationship between the intensity of an applied magnetic field (Hex) and the critical current density (Jc) of an NbN superconductor-laminated aromatic polyimide film of the present invention.

The Nb-containing superconductor-laminated aromatic polyimide material of the present invention comprises a substrate comprising an aromatic imide polymer and a layer formed on the substrate and comprising a Nb-containing superconductor.

There is no restriction on the form of the aromatic imide polymer substrate; for example, the substrate can be in the form of a filament, a film, or a membrane.

The Nb-containing superconductor layer preferably comprises at least one member selected from the group consisting of Nb-containing alloys and Nb-containing compounds, which alloys and compounds have a critical temperature equal to or higher than the temperature of liquid helium.

The Nb containing alloys for the superconductor layer are preferably selected from the group consisting of Nb-Ti alloys and Nb-Zr alloys. Also, the Nb containing compounds for the superconductor layer are preferably selected from the group consisting of NbN, $Nb_3Sn$, and $Nb_3Ge$. More preferably, the superconductor layer of the present invention comprises NbN.

In the present invention, the aromatic imide polymer for the substrate preferable comprises a polymerization-imidization product of an aromatic tetracarboxylic acid component comprising 50 to 100 molar %, more preferably 60 to 100 molar %, of at least one member selected from the group consisting of biphenyltetracarboxylic acids, and dianhydrides, esters and salts of the abovementioned acids and 0 to 50 molar %, more preferably 0 to 40 molar %, of at least one member selected from the group consisting of aromatic tetracarboxylic acids other than the biphenyltetracarboxylic acids, and dianhydrides, esters and salts of the other acids; with an aromatic diamine component comprising 50 to 100 molar %, more preferably 60 to 100 molar %, of at least one aromatic diamine having one benzene ring structure and 0 to 50 molar %, more preferably 0 to 40 molar %, of at least one aromatic diamine other than the abovementioned aromatic diamine.

In the aromatic tetracarboxylic acid component, the biphenyltetracarboxylic acid compounds are preferably selected from the group consisting of 2,3,3',4'-biphenyltetracarboxylic acid, 3,3',4,4'-biphenyltetracarboxylic acid and dianhydrides of the abovementioned acids, and the other aromatic tetracarboxylic acid compounds are preferably selected from the group consisting of pyromellitic acids, 3,3',4,4'-benzophenone tetracarboxylic acids, 3,3',4,4'-diphenylether tetracarboxylic acid and dianhydrides of the abovementioned acids.

In the aromatic diamine component, the aromatic diamine having one benzene ring structure is preferably, selected from the group consisting of phenylene diamines, for example, o-, m- and p-phenylene diamines, and diaminobenzoic acid compounds, for example, 3,5-diaminobenzoic acid, 2,4-diaminobenzoic acid, and alkyl 3,5-diamino-benzoates, and the other aromatic diamine is preferably selected from the group consisting of aromatic diamines having a two or more benzene ring structure, for example, diaminodiphenylethers such as 4,4'-diaminodiphenylether and 3,4'-diaminodiphenyl ether; diaminodiphenylmethanes such as 4,4'-diaminodiphenylmethane and 3,4'-diaminodiphenylmethane; 2,2-bis(aminophenyl)propanes such as 2,2-bis(4-aminophenyl)propane and 2,2-bis(3-aminophenyl)propane; and diaminobiphenyls such as 3,3'-dimethoxybenzidine and o-tolidine (3,3'-dimethylbenzidine).

The aromatic imide polymer substrate usable for the present invention is prepared by polymerizing the above-specified aromatic tetracarboxylic acid component and aromatic diamine component in an organic polar solvent; shaping the resultant polymeric acid dope solution into a predetermined form, for example, a filament film or membrane; solidifying the shaped dope solution by evaporating away the solvent or coagulating the shaped dope solution in a coagulating liquid, to provide a precursory substrate; and imidizing the polyamic acid in the precursory substrate to provide a shaped aromatic imide polymer substrate.

The resultant aromatic imide polymer substrate exhibits preferable mechanical properties, for example, tensile strength, ultimate elongation and flexural modulus of elasticity; thermal properties, for example, heat resistance, durability at a low temperature, and coefficient of thermal expansion; and electrical properties, for example, electric insulating property, for a substrate for the superconducting materials.

The aromatic imide polymer substrate usable for the present invention preferably exhibits a weight reduction of 5% or less when heated at a temperature of 550° C. for 60 minutes in a helium gas atmosphere, because the substrate must be able to withstand an Nb-containing superconductor layer-laminating process in which the substrate is heated at a temperature of from 450° C. to 600° C. in an inert gas atmosphere.

Also, the aromatic imide polymer substrate preferably exhibits a coefficient of linear expansion of from 0.4 to $2.0 \times 10^{-5}$ cm/cm/° C. at a temperature of from 30° C. to 300° C., because the Nb-containing superconductor layer is laminated on the substrate at the above-mentioned high temperature.

Further, the aromatic imide polymer substrate preferably exhibits a tensile strength of from 20 to 60 kg/mm² in liquid nitrogen, because the Nb-containing superconductor material is used at an extremely low temperature.

The lamination of the Nb-containing superconductor on the aromatic imide polymer substrate is carried out by, for example, a known vacuum evaporation coating method, sputter-coating method, chemical vaper deposition (CVD) method or ion beam coating method.

When the Nb-containing superconductor layer is formed by the vacuum evaporation method, the substrate is heated at a temperature of from 400° C. to 650° C., preferably from 450° C. to 600° C., in the presence or absence of nitrogen gas by applying electron beams, or laser rays, or by a heater; an Nb-containing superconductor substance is evaporation-coated on the substrate under a degree of vacuum of from $10^{-2}$ to $10^{-8}$ Torr, at a coating rate of from 0.05 to 1000 nm/sec, to form an Nb-containing superconductor layer having a thickness of from 20 to 2000 nm, preferably from 60 to 1000 nm, and if necessary, the resultant Nb-containing superconductor layer is annealed at a temperature of from 300° C. to 650° C. for from 5 to 180 minutes.

More preferably, the Nb-containing superconductor layer is formed by the sputtering coating method in which, for example, when an RF magnetron sputtering apparatus is used, the aromatic imide polymer substrate is heated at a temperature of 500° C. to 650° C.; an Nb-containing superconducting substance is sputter-coated on the substrate at a coating rate of from 0.01 to 100 nm/sec in an argon gas or argon-nitrogen mixed gas atmosphere to form a Nb-containing superconductor layer having a thickness of 50 to 10000 nm; and if necessary, the resultant Nb-containing superconductor layer is annealed at a temperature of from 300° C. to 650° C. for 5 to 180 minutes.

In the above-mentioned sputter-coating process, a plurality of compositions consisting of a plurality of components in the Nb-containing superconductor, an element, or a single composition consisting of a plurality of the components in the Nb-containing superconductor, may be utilized as a target.

In an embodiment of the Nb-containing superconductor-laminated aromatic polyimide material of the present invention, the Nb-containing superconductor layer is coated with and protected by a protective metal layer.

The protective metal layer preferably comprises a metal element or an alloy which has substantially no or a very low reactivity with the Nb-containing superconductor layer to be protected, even at a high temperature at which the protective metal layer is laminated on the Nb-containing superconductor layer. The metal element usable for forming the protective metal layer is preferably selected from alkali earth metal elements and transition metal elements, because those elements exhibit a very low penetration of and effect on the Nb-containing superconductor layer. The preferable metal elements are Mg, Ca, Pt, Cu, Ag and Au.

The alloy usable for forming the protective metal layer is preferably selected from alloys of two or more different types of transition metal elements. The transition metal alloys may contain a small amount of at least one types of non metallic element selected from, for example, C., B, Si, N and P. Preferable alloys are stainless steels, Stellite (trademark of Co-Cr-W alloys, made by Haynes Stellite Co.), and Hastelloy (trademark of Ni-Mo-C-Fe-Cr-W alloys, made by Haynes Stellite Co.).

The protecting metal layer can be formed on the Nb-containing superconductor layer by a usual physical depositing method, for example, a vacuum evaporation coating method or sputtering method.

When the protecting metal layer is formed by the vacuum evaporation method, the surface to be coated is heated at a temperature of from 200° C. to 600° C. by electron beams, laser rays or by a heater, as a heat source; and the evaporation procedure is carried out at a coating rate of 0.05 to 500 nm/sec under a degree of vacuum of from $10^{-2}$ to $10^{-8}$ Torr, to form a protective metal layer having a thickness of from 20 to 2000 nm, on the Nb-containing superconductor layer.

When the sputtering method, preferably, an RF magnetron sputtering method, is utilized, the surface to be coated is heated at a temperature of from 200° C. to 450° C.; and the sputter-coating procedure is carried out under a reduced atmospheric gas pressure of 1 Torr or less at a coating rate of 0.05 to 100 nm/sec, to form a protective metal layer having a thickness of 20 to 2000 nm on the Nb-containing superconductor layer.

In the above-mentioned vacuum evaporation coating method and sputter-coating method, the resultant protecting metal layer is optionally annealed at a temperature of from about 300° C. to 650° C. for 5 to 180 minutes to enhance the crystal orientation of the metal element or alloy in the protective metal layer.

In another embodiment of the Nb-containing superconductor-laminated aromatic polyimide material of the present invention, an intermediate metal layer is formed between the aromatic imide polymer substrate and the Nb-containing superconductor layer. The intermediate metal layer not only enhances the bonding strength between the aromatic imide polymer substrate and the Nb-containing superconductor layer, but also serves as a by-pass for electric current when the Nb-containing superconductor layer loses the super-conducting property thereof; i.e., the intermediate metal layer effectively stabilizes the Nb-containing superconductor-laminated aromatic polyimide material of the present invention.

The intermediate metal layer comprises a metal element or an alloy which has substantially no or a very poor reactivity with the Nb-containing superconductor layer to be formed thereon, even at a high temperature at which the Nb-containing superconductor layer is laminated thereon. The metal element and alloy usable for the intermediate metal layer can be selected from those usable for the above-mentioned protective metal layer.

Namely, the intermediate metal layer preferably comprises at least one member selected from the group consisting of metallic Mg, Ca, Pt, Cu, Ag, and Au and alloys comprising at least two transition metal elements.

Also, the intermediate metal layer can be formed on the aromatic imide polymer substrate by the same method as that used for the protective metal layer.

The intermediate metal layer preferably has a thickness of from 20 to 2000 nm.

In the Nb-containing superconductor-laminated aromatic polyimide material having the intermediate metal layer, the Nb-containing superconductor layer may be coated by the above-mentioned protective metal layer.

The Nb-containing superconductor-laminated aromatic polyimide material of the present invention is useful as a flexible superconducting material in the form of a filament or film (membrane) for superconducting wires, superconducting circuits and magnetic field-shielding plates, because the aromatic imide polymer substrate exhibits an excellent heat resistance, electric insulating property and mechanical strength, not only at a high temperature but also at an extremely low temperature.

The present invention will be further illustrated by way of specific examples, which are merely representative and do not restrict the scope of the present invention in any way.

EXAMPLE 1

Equimolar amounts of 3,3',4,4'-biphenyltetracarboxylic dianhydride and p-phenylene diamine were polymerized in a solvent consisting of N-methyl-2-pyrrolidone, at a temperature of 30° C. for 2 hours.

The resultant aromatic polyamic acid exhibited a logarithmic viscosity number of 3.5 determined in a solvent consisting of N-methyl-2-pyrrolidone at a concentration of 0.5 g/100 ml at a temperature of 30° C.

Also, the resultant aromatic polyamic acid dope solution had a polymer concentration of about 25% by weight and a solution viscosity of about 3000 poises at a temperature of 100° C.

The dope solution was spread on a film-forming surface of a base member at a temperature of 90° C., and the spread dope solution layer was then gradually dried at a temperature of about 110° C. while evaporating away the solvent, to prepare a solidified aromatic polyamic acid film containing about 15% by weight of the solvent. The solidified film was removed from the film-forming surface of the base member, and heated at a temperature of about 200° C. for 30 minutes, at a temperature of about 300° C. for 15 minutes, and then at a temperature of 450° C. for 15 minutes to imidize the aromatic polyamic acid in the solidified film.

The resultant aromatic polyimide film had a thickness of 50 nm and exhibited the following physical and mechanical properties.

Tensile strength at 30° C.: 45 kg/mm$^2$
Tensile strength in liquid nitrogen: 52 kg/mm$^2$
Ultimate elongation at 30° C.: 34%
Tensile modulus of elasticity at 30° C.: 843 kg/mm$^2$
Edge tear resistance (JIS): 51 kg/mm
Flexural resistance (MIT): 10,000 times or more
Glass transition temperature: 500° C. or more
Thermal shrinkage at 400° C.: 0.46%
Coefficient of linear expansion (at 30° C.-300° C.): $1.1 \times 10^{-5}$ cm/cm/°C.
Water absorption: 1.1% by weight
Weight reduction at 550° C. for 60 minutes in helium atmosphere: 2.6% by weight An NbN superconductor layer was formed on a surface of the aromatic imide polymer film, by a magnetron type high frequency wave bi-electrode sputtering apparatus.

In the NbN superconductor layer-preparing procedure, an aromatic imide polymer film substrate was fixed on a surface of an electrode in the apparatus; the pressure of the vacuum vessel in the apparatus was reduced to a degree of vacuum of $1 \times 10^{-4}$ Pa ($7.5 \times 10^{-7}$ Torr) or less; and the aromatic imide polymer film substrate was heated for one hour at a temperature of 300° C. under the above-mentioned vacuum, to degasify the film substrate.

The film substrate was heated at a temperature of 600° C. and sputter-coated with NbN in an argon-nitrogen mixed gas atmosphere while using Nb metal as a target, to form a NbN superconductor layer having a thickness of about 1500 nm.

The NbN superconductor layer was coated with a protective metal layer consisting of Cu and having a thickness of 1000 nm by the following sputter-coating method using copper (Cu) as a metal target.

In the magnetron type high frequency bi-electrode sputtering apparatus, the NbN superconductor-laminated aromatic imide polymer film substrate was fixed on an electrode in the apparatus; the pressure of the vacuum vessel in the apparatus was reduced to a degree of vacuum of $1 \times 10^{-4}$ Pa ($7.5 \times 10^{-7}$ Torr) or less; an argon gas having a purity of 99.999% by weight was introduced into the vacuum vessel to adjust the pressure of the vacuum vessel to 0.5 Pa ($3.75 \times 10^{-3}$ Torr); then the NbN superconductor layer was sputter-coated with a protective copper layer having a thickness of about 1000 nm while heating the NbN superconductor layer at a temperature of 200° C.

When the sputter-coating procedure with NbN was carried out under a nitrogen gas pressure of 2.2 m Torr, the resultant NbN superconductor-laminated aromatic polyimide film exhibited a critical temperature (Tc) of 17K.

Figure 2:
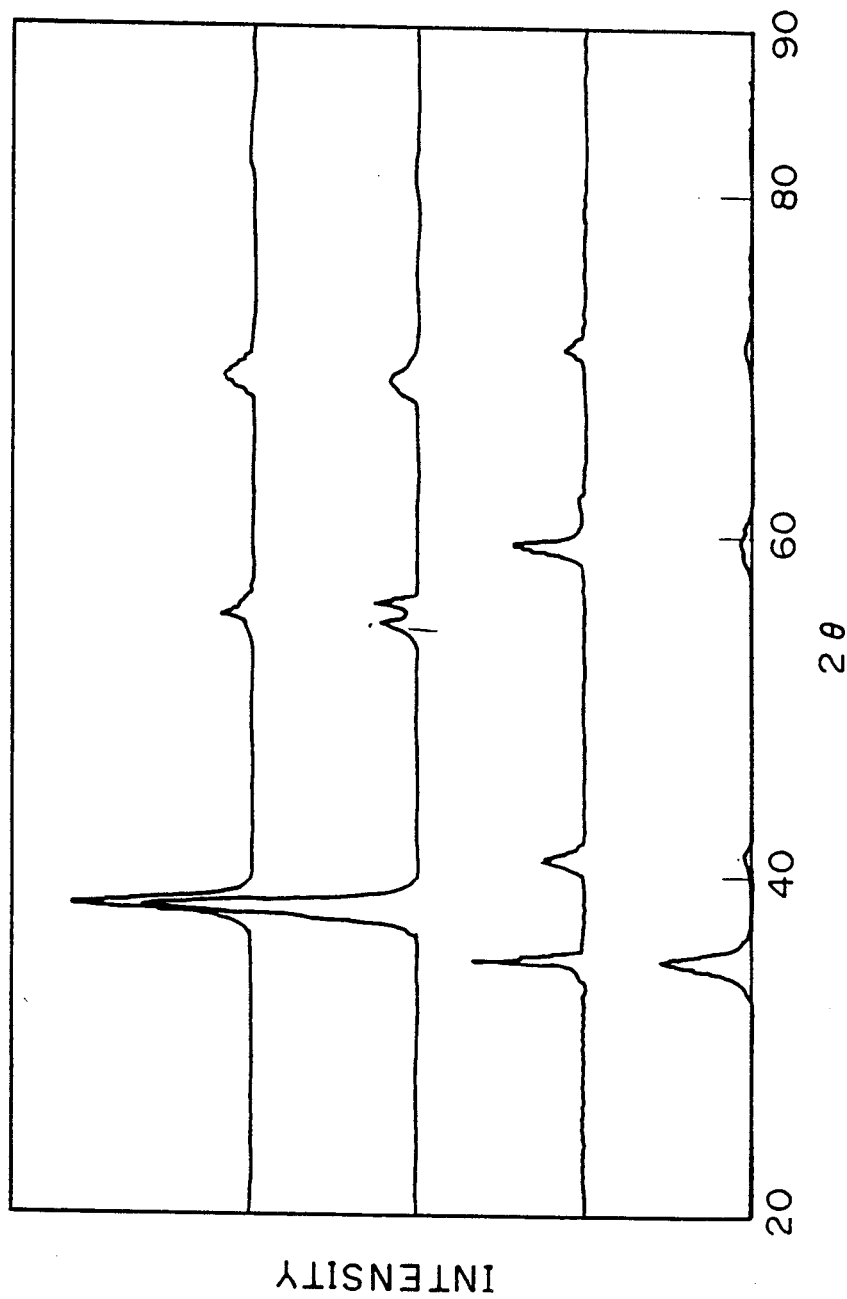
FIG. 2 is a graph showing X-ray diffraction patterns of the NbN superconductor-laminated aromatic polyimide film of the present invention.

This NbN superconductor-laminated aromatic polyimide film had a relationship between the intensity of applied magnetic field (Hex) and the critical current density (Jc) as shown in FIG. 1, and exhibited X-ray diffraction patterns as shown in FIG. 2.

FIGS. 1 and 2 show that the NbN superconductor-laminated aromatic polymer film of the present invention had a critical current density high enough for practical use, even at a high magnetic field intensity.

EXAMPLE 2

The same procedures as described in Example 1 were carried out, with the following exception.

An intermediate metal layer consisting of Cu and having a thickness of 1000 nm was formed on the aromatic imide polymer film substrate before the formation of the NbN superconductor layer, in the same manner as for the protective copper layer described in Example 1.

Also, a protective copper layer having a thickness of 1000 nm was formed on the NbN superconductor layer at a temperature of the superconductor layer of about 200° C.

Figure 3:
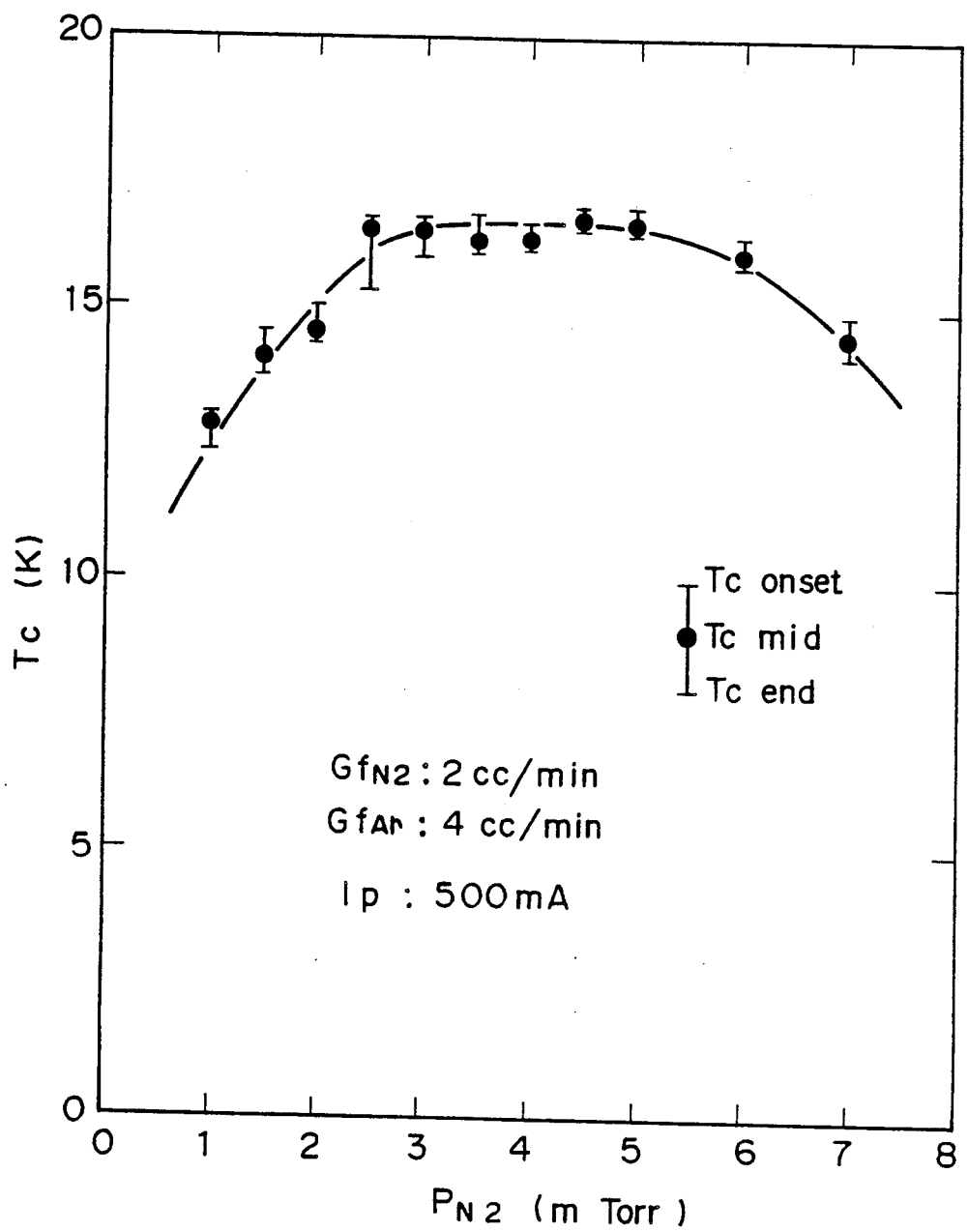
FIG. 3 is a graph showing a relationship between a partial nitrogen pressure ($P_{N2}$) in a sputtering operation for forming an NbN superconductor layer on an aromatic imide polymer film and a critical temperature (Tc) of the resultant NbN superconductor layer.
Figure 4:
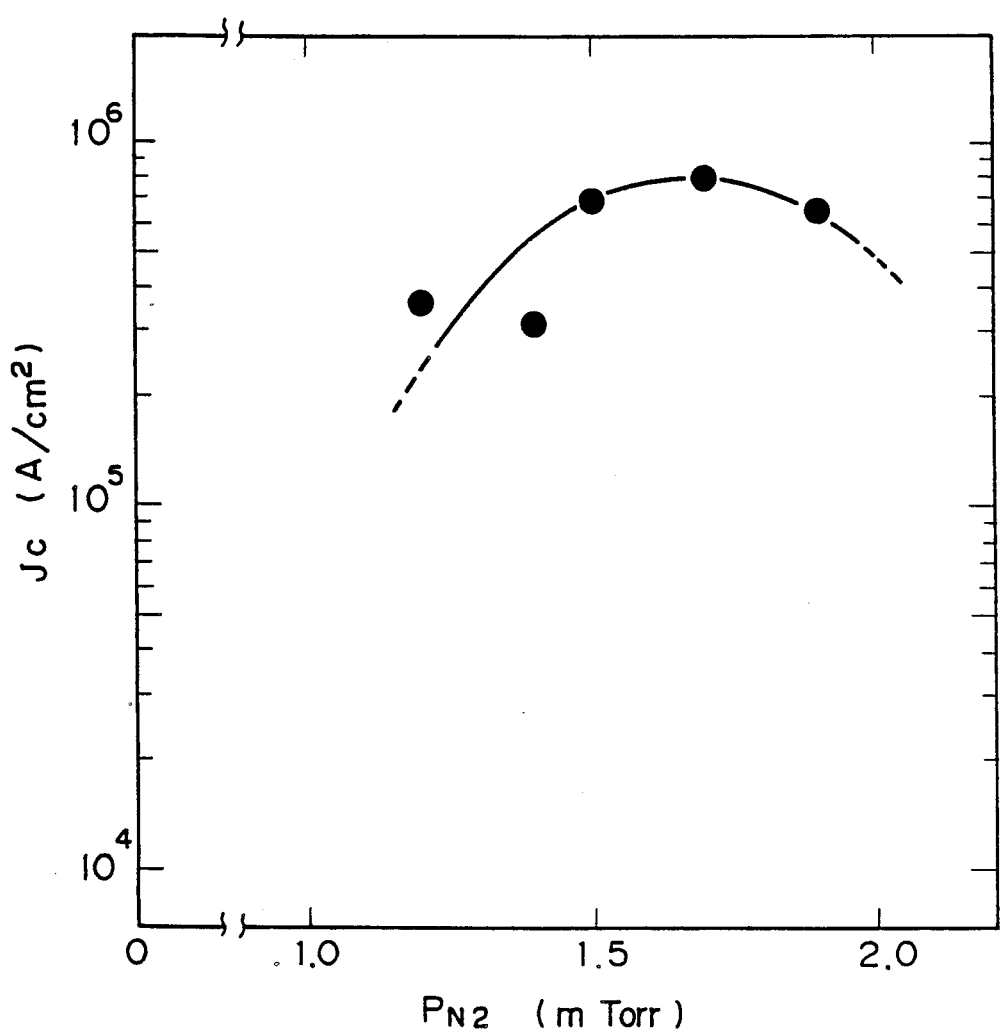
FIG. 4 is a graph showing a relationship between a partial nitrogen pressure ($P_{N2}$) in a sputtering operation for forming an NbN superconductor layer on an aromatic imide polymer film and a critical current density (Jc) of the resultant NbN superconductor layer; and, FIG. 5 is a graph showing a temperature dependence of a critical current density (Jc) of the above-mentioned NbN superconductor layer, at sputtering times of 3, 15, and 30 minutes.

The resultant NbN superconductor-laminated aromatic polyamide film exhibited a relationship between the partial nitrogen pressure ($P_{N2}$) in a sputtering operation for forming an NbN superconductor layer on the aromatic imide polymer film and the critical temperature (Tc) of the NbN superconductor layer as shown in FIG. 3, and a relationship between the partial nitrogen pressure ($P_{N2}$) and a critical current density (Jc) of the NbN superconductor layer as shown in FIG. 4.

Figure 5:
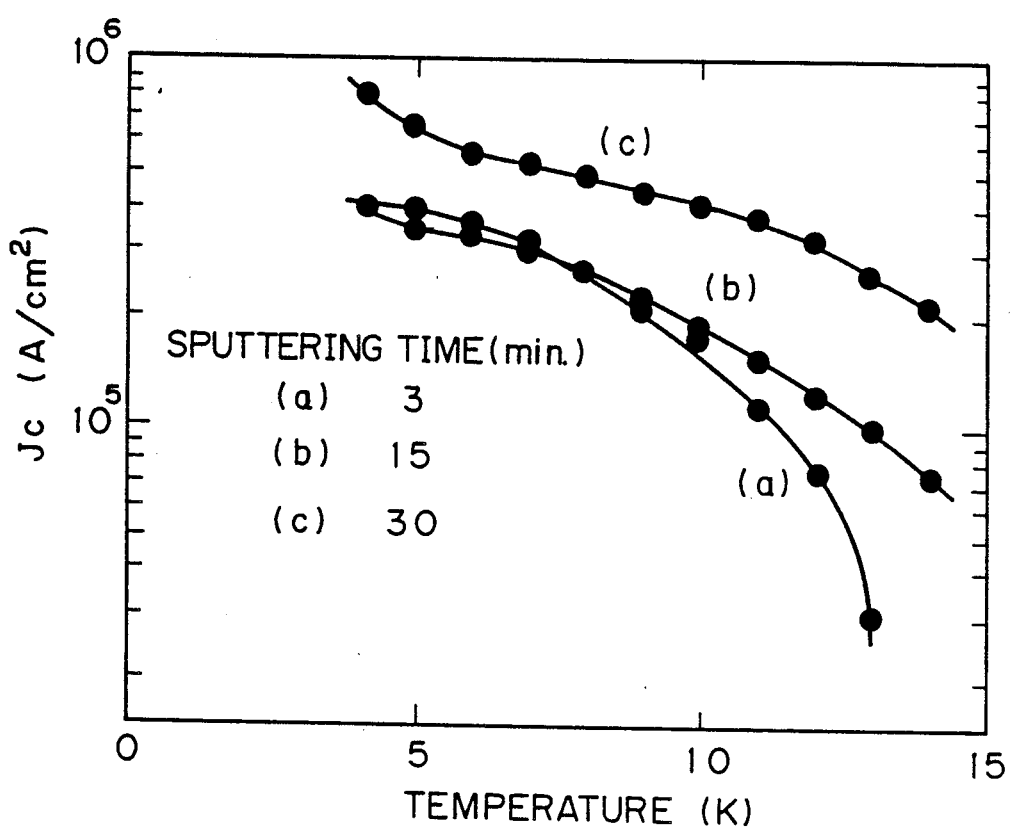

The critical current density (Jc) is variable depending on the temperature of the NbN superconductor layer and on the sputtering time. FIG. 5 is a graph showing a relationship between the temperature dependence of the critical current density (Jc) of the NbN superconductor layer at the sputtering times of 3 minutes, (Curve (a)) 15 minutes (Curve (b)), and 30 minutes (Curve (c)).

FIGS. 3 to 5 indicate that the Nb-containing superconductor-laminated aromatic polyimide film of the present invention had a satisfactory critical temperature, critical current density, and super-conducting property for practical use.

We claim:
1. A niobium-containing superconductor-laminated aromatic polyimide material comprising:
(A) a substrate comprising an aromatic imide polymer which comprises a polymerization-imidization product of (a) an aromatic tetracarboxylic acid component comprising (i) 50 to 100 molar % of at least one member selected from the group consisting of biphenyltetracarboxylic acids, and dianhydrides, esters, and salts of said biphenyltetracarboxylic acids, and (ii) 0 to 50 molar % of at least one member selected from the group consisting of aromatic tetracarboxylic acids other than the biphenyltetracarboxylic acids, and dianhydrides, esters, and salts of said other acids; with (b) an aromatic diamine component comprising (i) 50 to 100 molar % of at least one aromatic diamine having one benzene ring structure and (ii) 0 to 50 molar % of at least one other aromatic diamine; and (B) a layer (i) comprising a niobium-containing superconductor which comprises at least one member selected from the group consisting of Nb-containing alloys and Nb-containing compounds, which alloys and compounds have a critical temperature equal to or higher than the temperature of liquid helium, (ii) having a thickness of from 50 to 10,000 nm, and (iii) laminated on the aromatic imide polymer substrate.

2. The superconductor-laminated polyimide material as claimed in claim 1, wherein the biphenyltetracarboxylic acid compounds are selected from the group consisting of 2,3,3',4'-biphenyltetracarboxylic acid, 3,3',4,4'-biphenyltetracarboxylic acid and dianhydrides of the above-mentioned acids.

3. The superconductor-laminated polyimide material as claimed in claim 2, wherein the other aromatic tetracarboxylic acid compounds are selected from the group consisting of pyromellitic acids, 3,3',4,4'-benzophenone tetracarboxylic acids, 3,3',4,4'-diphenylether tetracarboxylic acid and dianhydrides of the above-mentioned acids.

4. The superconductor-laminated polyimide material as claimed in claim 2, wherein the aromatic diamine having a one benzene ring structure is selected from the group consisting of o-, m- and p-phenylene diamines, 3,5-diaminobenzoic acid, 2,4-diaminobenzoic acid, and alkyl 3,5-diamino-benzoates.

5. The superconductor-laminated polyimide material as claimed in claim 2, wherein the other aromatic diamine is selected from the group consisting of diaminodiphenylethers, diaminodiphenylmethanes, 2,2-bis-(aminophenyl)propanes and diaminobiphenyls.

6. The superconductor-laminated polyimide material as claimed in claim 1, wherein the aromatic imide polymer substrate exhibits a weight reduction of 5% or less when heated at a temperature of 550° C. for 60 minutes in a helium gas atmosphere.

7. The superconductor-laminated polyimide material as claimed in claim 1, wherein the aromatic imide polymer substrate exhibits a coefficient of linear expansion of from 0.4 to $2.0 \times 10^{-5}$ cm/cm/°C. at a temperature of from 30° C. to 300° C.

8. The superconductor-laminated polyimide material as claimed in claim 1, wherein the aromatic imide polymer substrate exhibits a tensile strength of from 20 to 60 kg/mm in liquid nitrogen.

9. The superconductor-laminated polyimide material as claimed in claim 1, wherein the substrate is in the form of a filament.

10. The superconductor-laminated polyimide material as claimed in claim 1, wherein the substrate is in the form of a film.

11. The superconductor-laminated polyimide material as claimed in claim 12, wherein the Nb-containing alloys are selected from the group consisting of Nb-Ti alloys and Nb-Zr alloys.

12. The superconductor-laminated polyimide material as claimed in claim 11, wherein the Nb-containing compounds are selected from the group consisting of NbN, $Nb_3Sn$ and $Nb_3Ge$.

13. The superconductor-laminated polyimide material as claimed in claim 1, wherein the Nb-containing superconductor layer has a thickness of from 50 to 2000 nm.

14. The superconductor-laminated aromatic polyimide material as claimed in claim 1, wherein the Nb-containing superconductor layer is coated with a protective metal layer comprising at least one member selected from the group consisting of metallic Mg, Ca, Pt, Cu, Ag and Au and alloys comprising at least two transition metal elements and having a thickness of 20 to 2000 nm.

15. The superconductor-laminated polyimide material as claimed in claim 1, which further comprises an intermediate metal layer formed between the aromatic imide polymer substrate and the Nb-containing superconductor layer.

16. The superconductor-laminated polyimide material as claimed in claim 15, wherein the intermediate metal layer comprises at least one member selected from the group consisting of metallic Mg, Ca, Pt, Cu, Ag and Au and alloys comprising at least two transition metal elements.

17. The superconductor-laminated polyimide material as claimed in claim 15, wherein the intermediate metal layer has a thickness of 20 to 2000 nm.

* * * * *